(12) United States Patent
Tsai et al.

(10) Patent No.: US 6,665,933 B2
(45) Date of Patent: Dec. 23, 2003

(54) PROCESS FOR FABRICATING HEAT SINK WITH HIGH-DENSITY FINS

(75) Inventors: Kuo-Ying Tsai, Taoyuan (TW); Chih-Jen Chen, Taoyuan (TW)

(73) Assignee: Delta Electronics, Inc., Taoyuan Shien (TW)

( * ) Notice: Subject to any disclaimer, the term of this patent is extended or adjusted under 35 U.S.C. 154(b) by 51 days.

(21) Appl. No.: 10/011,005

(22) Filed: Nov. 30, 2001

(65) Prior Publication Data

US 2002/0152858 A1 Oct. 24, 2002

(30) Foreign Application Priority Data

Feb. 27, 2001 (TW) ........................................ 90104607 A

(51) Int. Cl.⁷ .............................................. B21D 53/02
(52) U.S. Cl. .................................................. 29/890.03
(58) Field of Search ........................ 29/890.03, 890.05, 29/557, 558, 428

(56) References Cited

U.S. PATENT DOCUMENTS

| | | | | |
|---|---|---|---|---|
| 5,406,698 A | * | 4/1995 | Lipinski | 29/727 |
| 5,428,897 A | * | 7/1995 | Jordan et al. | 29/890.03 |
| 6,134,783 A | * | 10/2000 | Bargman et al. | 29/890.03 |
| 6,202,303 B1 | * | 3/2001 | Trobough | 29/890.03 |
| 6,301,779 B1 | * | 10/2001 | Azar | 29/890.03 |
| 6,339,880 B1 | * | 1/2002 | Ohta | 29/890.03 |

* cited by examiner

*Primary Examiner*—I Cuda-Rosenbaum
(74) *Attorney, Agent, or Firm*—Knobbe Martens Olson & Bear LLP

(57) ABSTRACT

A process for fabricating a heat sink with high-density parallel fins is provided. The process includes steps of providing a metal block including a first base and a second base, the first base being rectangular-solid shaped, the second base being rhombus-shaped and disposed over the first base wherein the second base includes a first edge surface and a second edge surface inclined at a specific angle, cutting the second base from a position on the top surface of the second base and parallel with the first edge surface until the first base is reached, thereby forming an inclined sheet, adjusting the inclined sheet to be normal to the top surface of the first base, thereby forming a fin, and repeating the cutting step and the adjusting step to produce the heat sink with high-density parallel fins.

10 Claims, 6 Drawing Sheets

PROCESS FOR FABRICATING HEAT SINK WITH HIGH-DENSITY FINS

FIELD OF THE INVENTION

The present invention relates to a process for fabricating a heat sink, and more particularly to a process for fabricating a heat sink with high-density fins.

BACKGROUND OF THE INVENTION

An integrated circuit chip is widely used in an electrical appliance such as a computer. When the electrical appliance operates, the chip generates energy in the form of heat. If the chip is unable to transfer enough heat to ambient air, the elevated operating temperature may result in damage of the chip or the breakdown of the whole appliance. In order to remove most heat generated from the chip, especially a CPU (central processing unit), a heat sink is usually provided and attached on the top surface of the chip. The heat sink is made of a highly thermal conductive material such as aluminum and copper and has a larger surface area than the attached chip for improving heat transfer. Since the surface area has a major influence on the overall heat transfer, the heat sink is generally constructed to have a flat base with a plurality of parallel fins or pin fins extending outwardly therefrom. Furthermore, in order to dissipate more heat, a heat sink with a greater number of fins, which is referred as a high-density fin heat sink, is developed.

The typical process for fabricating heat sinks includes an extrusion process, a gang sawing process and a bonding process. It is known that the thickness and number of fins produced by the extrusion process are restricted by the structural limitation and stress loading limitation of a die. If the number of fins increases, the die fingers become weaker and thus easily break off. Therefore, the extrusion process is not suitable for fabricating the high-density fin heat sink. The gang sawing process is performed by cutting off portions of a metal block to produce fins having predetermined thickness, number, depth and gap, which results in a great loss of material. In the bonding process, each fin is individually bonded into a base of a heat sink, which is time-consuming and labor intensive. In addition, the fins which are not well-bonded into the base are likely to fall and thus be detached from the base.

Therefore, the present invention provides an improved process for fabricating a heat sink with high-density fins for overcoming the problems described above.

SUMMARY OF THE INVENTION

It is an object of the present invention to provide a process for fabricating a heat sink with high-density fins, which is less costly and more timesaving than prior art.

It is another object of the present invention to provide a process for fabricating a heat sink with high-density fins, wherein the height, thickness and gap of the fins can be predetermined.

In accordance with an aspect of the present invention, there is provided a process for fabricating a heat sink with high-density parallel fins. The process includes steps of:

providing a metal block including a first base and a second base, the first base being rectangular-solid shaped, the second base being rhombus-shaped and disposed over the first base wherein the second base includes a first edge surface and a second edge surface inclined at a specific angle;

cutting the second base from a position on the top surface of the second base and parallel with the first edge surface until the first base is reached, thereby forming an inclined sheet;

adjusting the inclined sheet to be normal to the top surface of the first base, thereby forming a fin; and repeating the cutting step and the adjusting step to produce the heat sink with high-density parallel fins.

Preferably, the first base and the second base are integrally formed.

Preferably, the specific angle is in the range from 20 to 80 degrees; and more preferably in the range from 30 to 60 degrees.

In accordance with another aspect of the present invention, there is provided a process for fabricating a heat sink with high-density pin fins. The process includes steps of:

(a) providing a metal base block including a first base and a second base, the first base being rectangular-solid shaped, the second base being rhombus-shaped and disposed over the first base wherein the second base includes a first edge surface and a second edge surface inclined at a first specific angle and a third edge surface and a fourth edge surface inclined at a second specific angle;

(b) cutting the second base from a first position on the top surface of the second base and parallel with the first edge surface until the first base is reached, thereby forming an inclined sheet;

(c) adjusting the inclined sheet to be normal to the top surface of the first base, thereby forming a first fin;

(d) repeating the step (b) and the step (c) to produce a plurality of the first fins;

(e) cutting the second base from a second position on the top surface of the second base and parallel with the third edge surface until the first base is reached, thereby forming a plurality of inclined pins in a row;

(f) adjusting the plurality of inclined pins to be normal to the top surface of the first base, thereby forming a plurality of pin fins in a row; and (g) repeating the step (e) and the step (f) step to produce a heat sink with high-density pin fins.

Preferably, the first base and the second base are integrally formed.

Preferably, the first specific angle is in the range from 20 to 80 degrees; and more preferably in the range from 30 to 60 degrees.

Preferably, the second specific angle is in the range from 20 to 80 degrees; and more preferably in the range from 30 to 60 degrees.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1A:
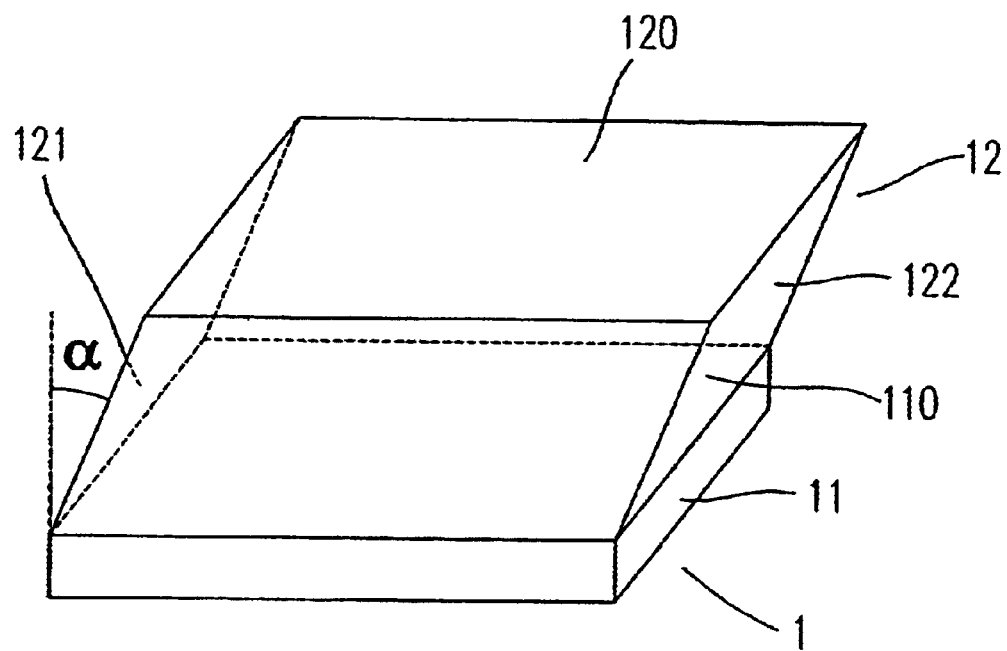
FIGS. 1(a)–1(f) illustrate the steps for fabricating a heat sink with high-density parallel fins according to a first embodiment of the present invention.
Figure 1B:
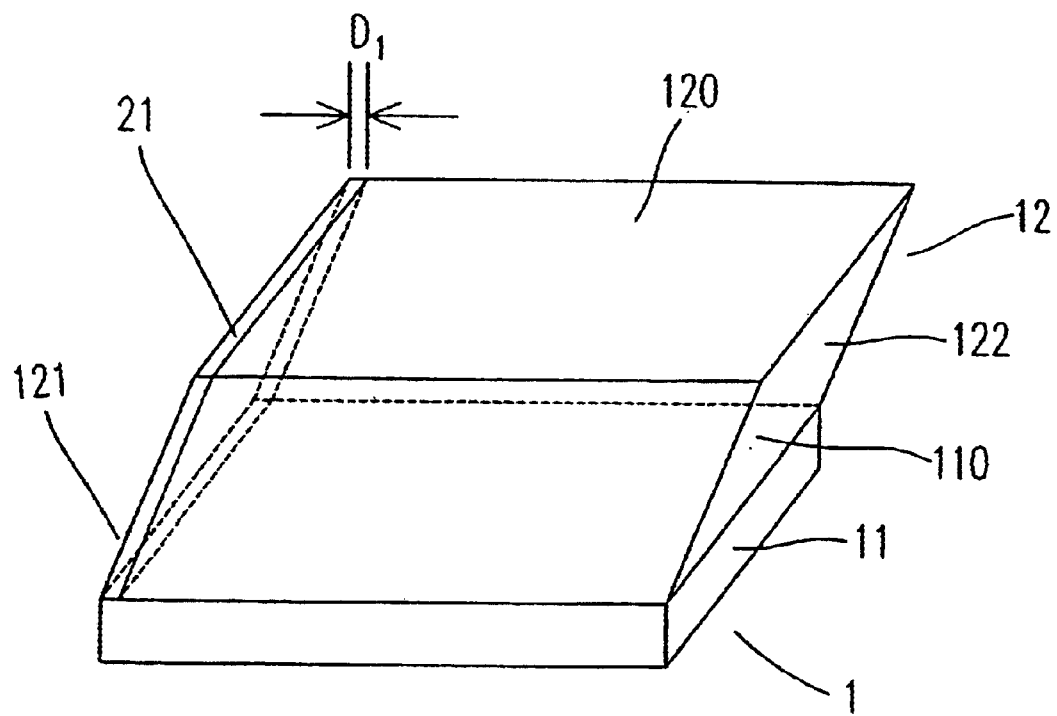
Figure 1C:
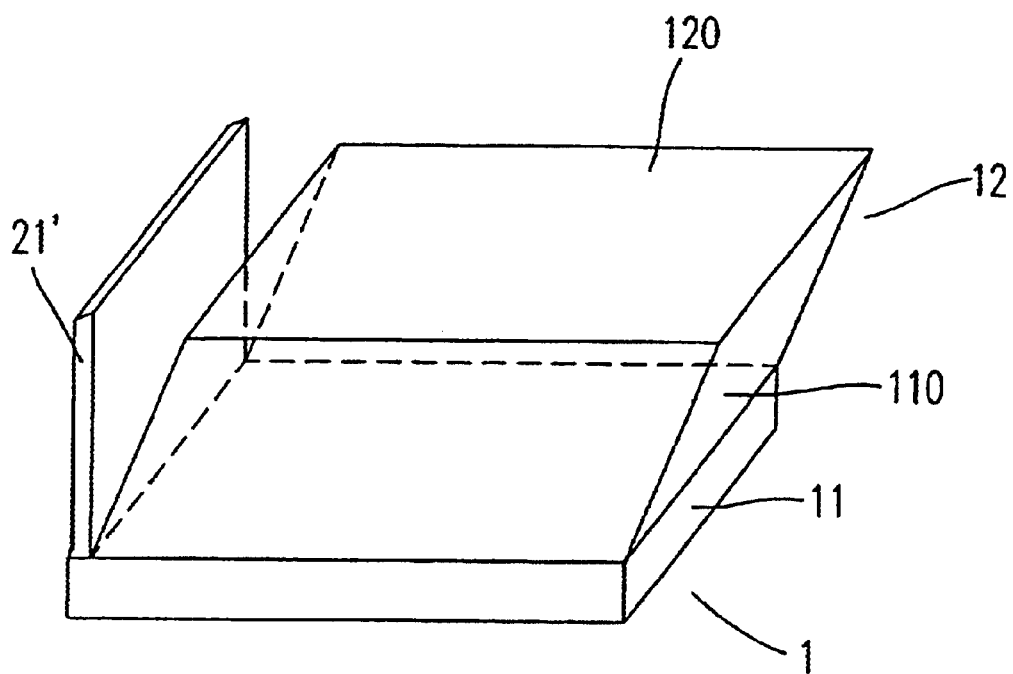
Figure 1D:
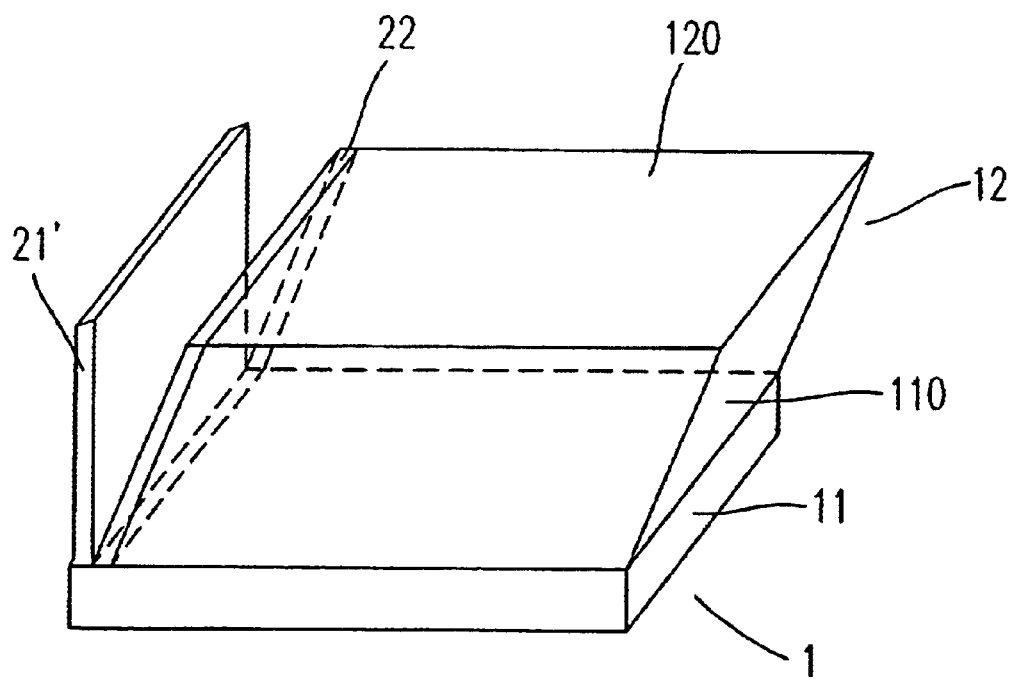
Figure 1E:
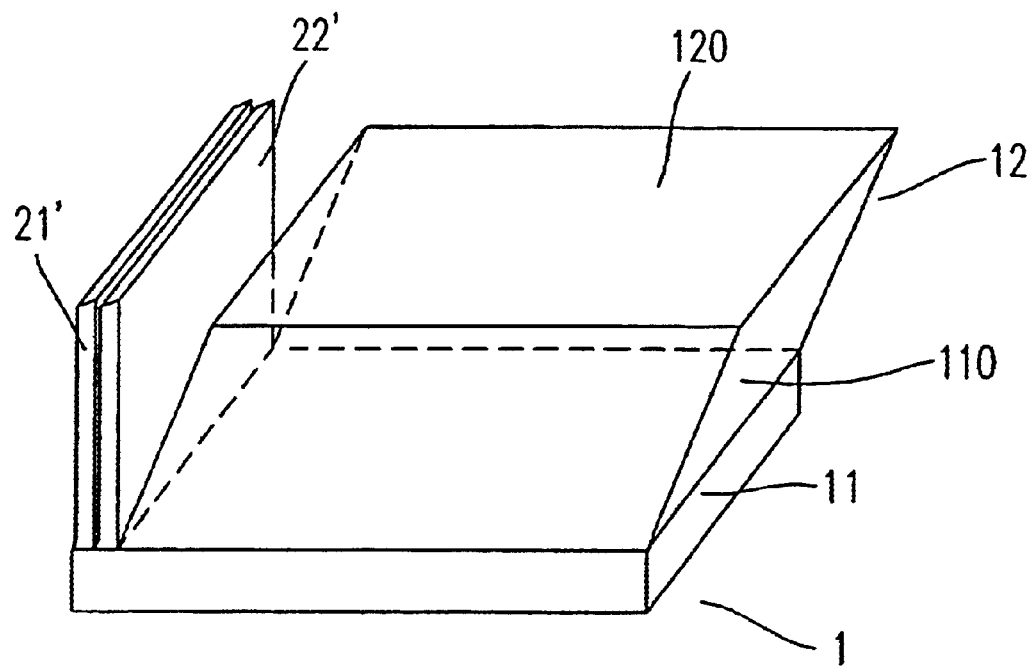
Figure 1F:
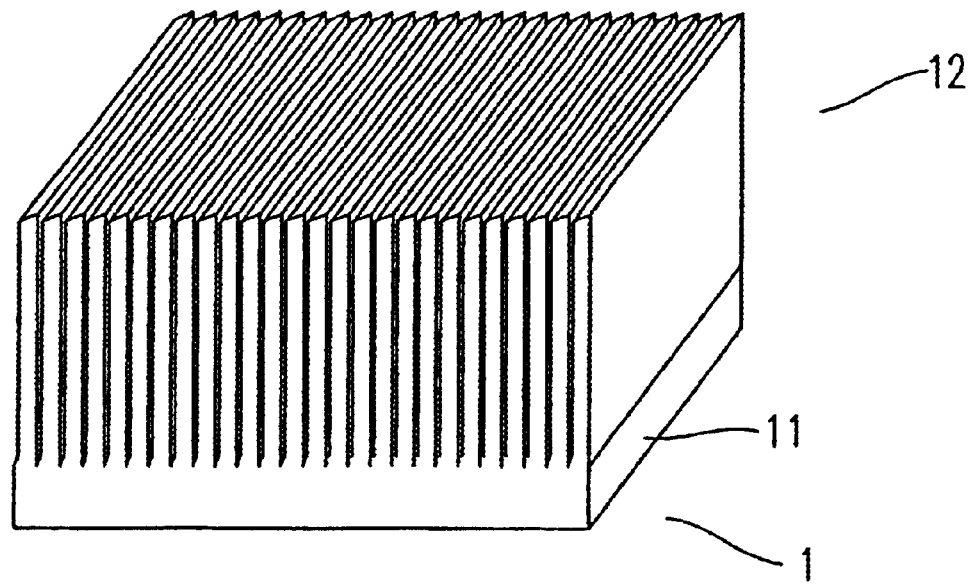

Please refer to FIGS. 1(a) to 1(f). In FIG. 1(a), a metal block 1 is provided. The metal block 1 includes a first base 11 and a second base 12 wherein the first base 11 and the second base 12 are integrally formed by molding. The first base 11 is rectangular-solid shaped. The second base 12 is rhombus-shaped and disposed over the first base 11. The second base 12 includes a top surface 120, a first edge surface 121 and a second edge surface 122. The first edge surface 121 and the second edge surface 122 are inclined at a specific angle α. In FIG. 1(b), the second base 12 is cut from a position on the top surface 120. The position has a distance D1 from the first edge surface 121. The second base 12 is cut parallel with the first edge surface, i.e. with the specific angle α, until the first base 11 is reached. Therefore, a first inclined sheet 21 is formed. As can be seen in FIG. 1(c), when the first inclined sheet 21 is adjusted normal to a top surface 110 of the first base 11, a first fin 21' is formed. In FIG. 1(d), the second base 12 is continuously cut with the specific angle α until the first base 11 is reached, thereby forming a second inclined sheet 22. In FIG. 1(e), a second fin 22' is formed when the second inclined sheet 22 is adjusted normal to the top surface 110 of the first base 11. When the above-mentioned cutting step and adjusting step are repeated, a heat sink with a plurality of parallel fins, i.e. high-density parallel fins, is produced, as can be seen in FIG. 1(f).

Figure 2A:
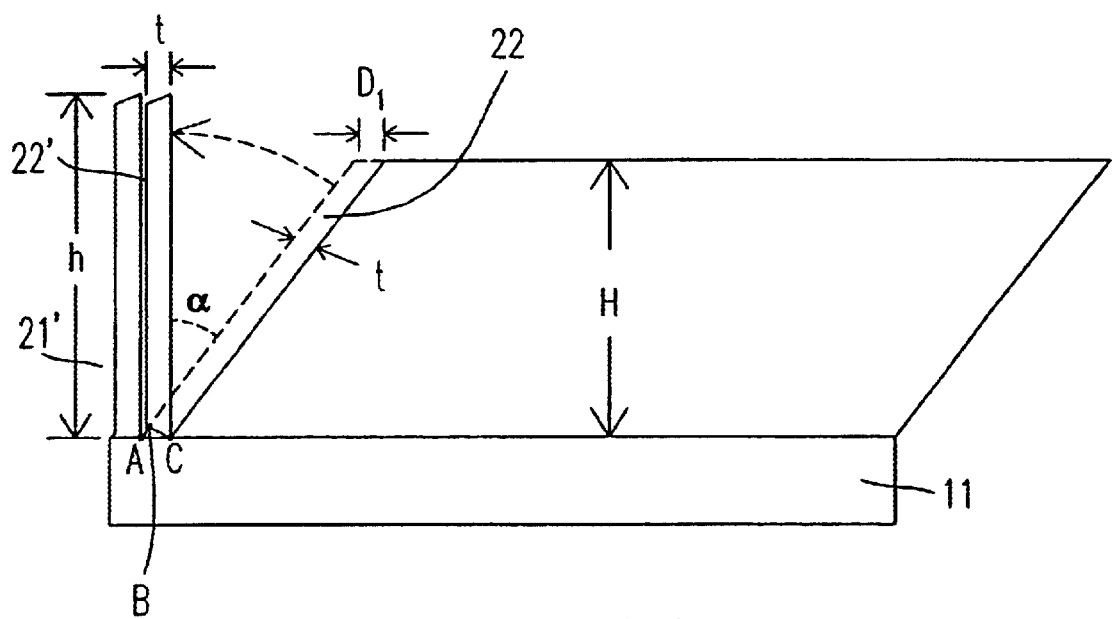
FIGS. 2(a) and 2(b) are schematic views illustrating the concept employed in the process for fabricating the heat sink in FIGS. 1(a) to 1(f)
Figure 2B:
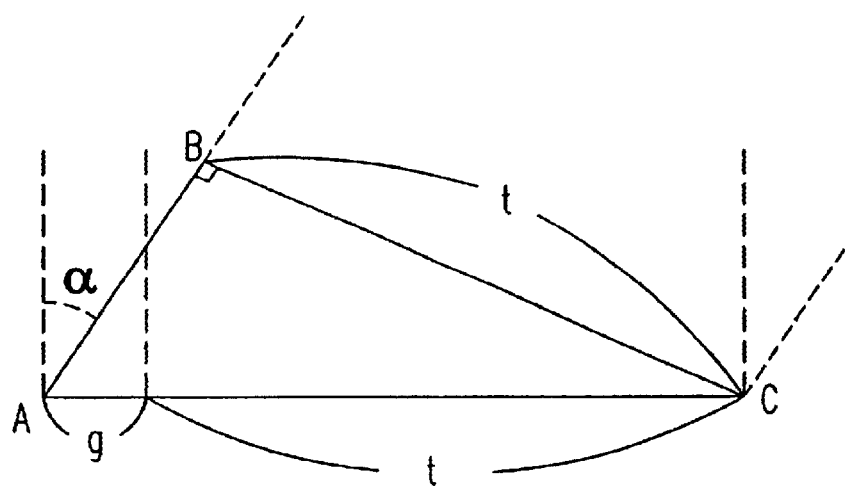

FIGS. 2(a) and 2(b) are schematic views illustrating the concept employed in the process for fabricating the heat sink in FIGS. 1(a) to 1(f). When the second inclined sheet 22 is adjusted to form the second fin 22', a thickness t of the second fin 22' and a gap g between the first fin 21' and the second fin 22' are simultaneously defined. FIG. 2(b) is an enlarged view showing the triangle ΔABC. The height h of the second fin 22' is approximately equal to the height (H) of the second base divided by cos α, that is to say:

$$h = \frac{H}{\cos\alpha} \quad (1)$$

Please refer to FIG. 2(b). In the triangle ΔABC, the length of AC=D1=g+t, and the length of BC=t. Therefore, $$\cos\alpha = \frac{BC}{AC} = \frac{t}{g+t} \quad (2)$$

From equation (2), we obtain:

$$g = \frac{t \times (1 - \cos\alpha)}{\cos\alpha} \quad (3)$$

$$t = AC(\cos\alpha) = D_1(\cos\alpha) \quad (4)$$

Accordingly, the gap g, the thickness t and the height h of the heat sink according to the present invention can be calculated by predetermining the specific angle α, the distance D1 and the height H of the second base 12.

In accordance with the present invention, the specific angle α is preferably in the range from 20 to 80 degrees, and more preferably in the range from 30 to 60 degrees.

Figure 3A:
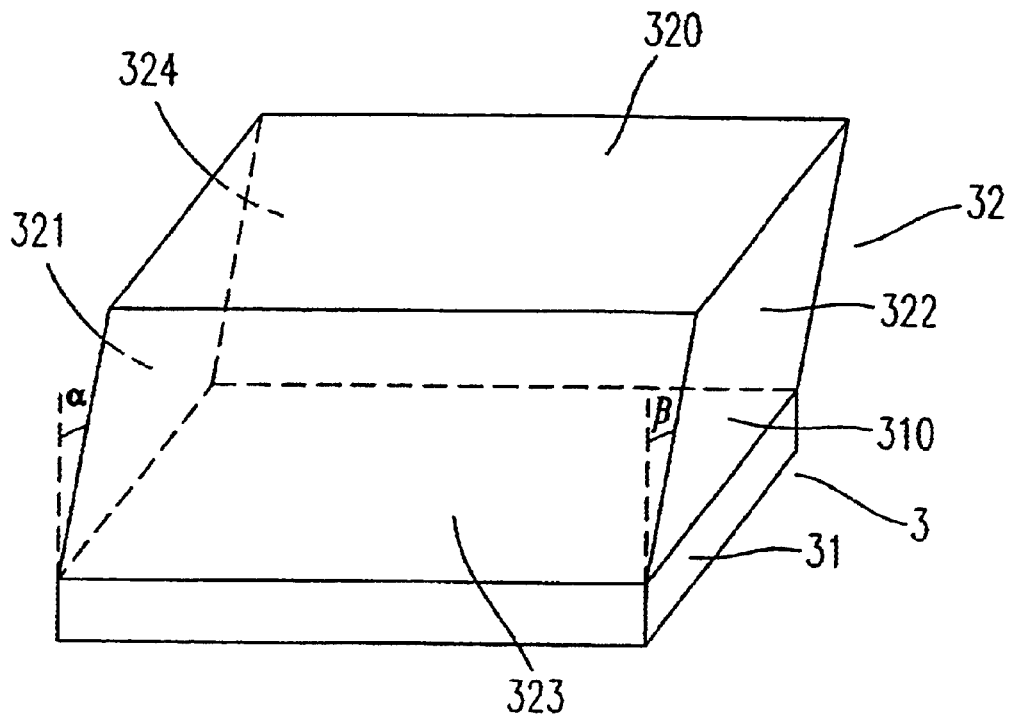
FIGS. 3(a)–3(d) illustrate the steps for fabricating a heat sink with high-density pin fins according to a second embodiment of the present invention.
Figure 3B:
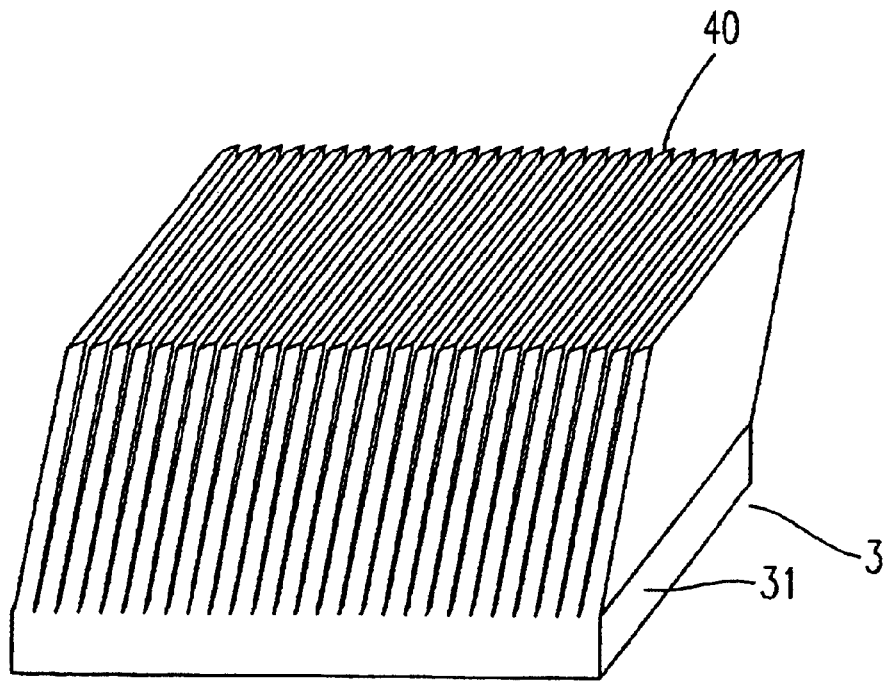
Figure 3C:
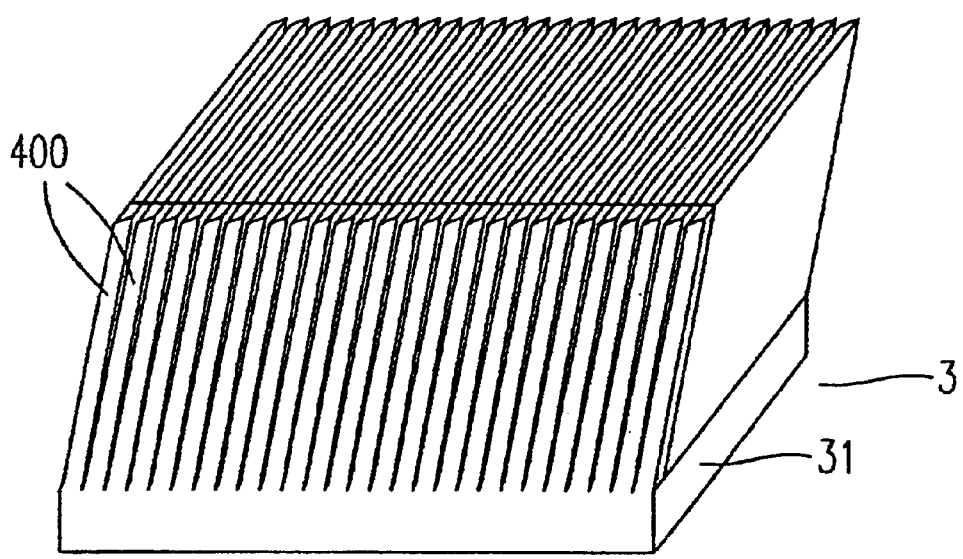
Figure 3D:
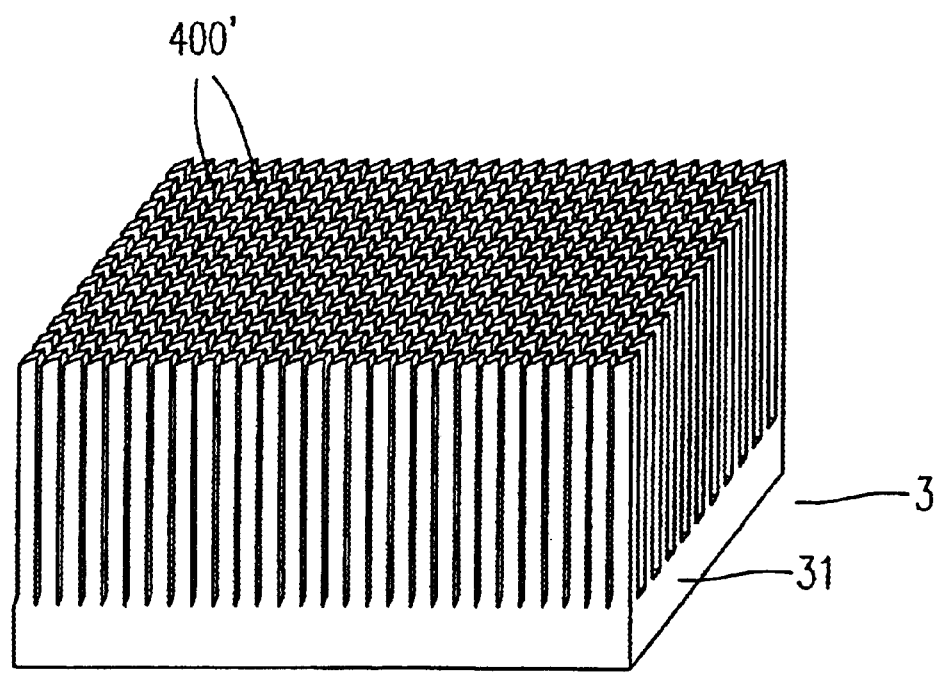

FIGS. 3(a) to 3(d) illustrate the steps for fabricating a heat sink with high-density pin fins according to a second embodiment of the present invention. In FIG. 3(a), a metal block 3 is provided. The metal block 3 includes a first base 31 and a second base 32, wherein the first base 31 and the second base 32 are integrally formed by molding. The first base 31 is rectangular-solid shaped. The second base 32 is rhombus-shaped and disposed over the first base 11. The second base 32 includes a top surface 320, a first edge surface 321, a second edge surface 322, a third edge surface 323 and a fourth edge surface 324. The first edge surface 321 and a second edge surface 322 are inclined at a first specific angle α. The third edge surface 323 and a fourth edge surface 324 are inclined at a second specific angle β. The steps shown in FIGS. 1(a) to 1(f), i.e. repeating the step of cutting the second base 32 at the first inclined angle α to form a plurality of inclined sheets and the step of adjusting the inclined sheets normal to a top surface 310 of the first base 31 for forming a plurality of parallel fins 40, are implemented to produce a heat sink with high-density parallel fins, as can be seen in FIG. 3(b). In FIG. 3(c), the second base 32 is cut from a position on a top surface 320 thereof and parallel with the third edge surface 323 at the second specific angle β until the first base 31 is reached, thereby forming a row of inclined pins 400. When the row of inclined pins 400 are adjusted normal to the top surface 310 of the first base 31, a row of pin fins 400' are formed. When the cutting step and adjusting step are repeated, a heat sink with high-density pin fins 400' is produced.

In this embodiment, each of the first specific angle α and the second specific angle β is preferably in the range from 20 to 80 degrees, and more preferably in the range from 30 to 60 degrees.

As will be apparent from the above description, the process for fabricating a heat sink with high-density fins according to the present invention has the following advantages:

(1) The height and thickness of each fin and the gap between fins can be predetermined so as to meet the requirement of the user.

(2) The process of the present invention can produce a heat sink with a greater number of fins than the traditional extrusion process, because the structural limitation and stress loading limitation of a die can be avoided.

(3) When compared with the gang sawing process, the present invention can produce a heat sink with high-density fins without cutting off portions of a metal block and thus save material.

(4) When compared with the bonding process, the present invention is more timesaving and less costly.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for fabricating a heat sink with high-density parallel fins, the process comprising:

providing a metal block comprising a first base and a second base, said first base being rectangular-solid shaped, said second base being rhombus-shaped and disposed over said first base, wherein said second base comprises a first edge surface and a second edge surface inclined at a specific angle;

cutting said second base from a position on the top surface of said second base and parallel with said first edge surface until said first base is reached, thereby forming an inclined sheet;

adjusting said inclined sheet to be normal to the top surface of said first base, thereby forming a fin; and repeating said cutting and said adjusting to produce said heat sink with high-density parallel fins.

2. The process according to claim 1, wherein said first base and said second base are integrally formed.

3. The process according to claim 1, wherein said specific angle is in the range from 20 to 80 degrees.

4. The process according to claim 1, wherein said specific angle is in the range from 30 to 60 degrees.

5. A process for fabricating a heat sink with high-density pin fins, the process comprising:

providing a metal block comprising a first base and a second base, said first base being rectangular-solid shaped, said second base being rhombus-shaped and disposed over said first base, wherein said second base comprises a first edge surface and a second edge surface inclined at a first specific angle and a third edge surface and a fourth edge surface inclined at a second specific angle;

cutting said second base from a first position on the top surface of said second base and parallel with said first edge surface until said first base is reached, thereby forming an inclined sheet;

adjusting said inclined sheet to be normal to the top surface of said first base, thereby forming a first fin;

repeating said cutting and thereby forming the inclined sheet, and said adjusting and thereby forming the first fin to produce a plurality of said first fins;

cutting said second base from a second position on the top surface of said second base and parallel with said third edge surface until said first base is reached, thereby forming a plurality of inclined pins in a row;

adjusting said plurality of inclined pins to be normal to the top surface of said first base, thereby forming a plurality of pin fins in a row; and repeating said cutting and thereby forming the plurality of inclined pins in a row, and said adjusting and thereby forming the plurality of pin fins in a row to produce a heat sink with high-density pin fins.

6. The process according to claim 5, wherein said first base and said second base are integrally formed.

7. The process according to claim 5, wherein said first specific angle is in the range from 20 to 80 degrees.

8. The process according to claim 5, wherein said first specific angle is in the range from 30 to 60 degrees.

9. The process according to claim 5, wherein said second specific angle is in the range from 20 to 80 degrees.

10. The process according to claim 5, wherein said second specific angle is in the range from 30 to 60 degrees.

\* \* \* \* \*